(12) United States Patent
Sato

(10) Patent No.: US 11,175,598 B2
(45) Date of Patent: Nov. 16, 2021

(54) IMPRINT APPARATUS AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 346 days.

(21) Appl. No.: 16/020,126

(22) Filed: Jun. 27, 2018

(65) Prior Publication Data

US 2019/0004441 A1 Jan. 3, 2019

(30) Foreign Application Priority Data

Jun. 30, 2017 (JP) .............................. JP2017-129596
Jun. 8, 2018 (JP) .............................. JP2018-110511

(51) Int. Cl.
*G03F 7/00* (2006.01)
*G03F 9/00* (2006.01)

(52) U.S. Cl.
CPC .......... *G03F 9/7042* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 7,420,654 B2 | 9/2008 | Cherala et al. | |
| 8,496,462 B2 | 7/2013 | Kimura | |
| 9,372,396 B2 | 6/2016 | Kruijt-Stegeman et al. | |
| 9,810,979 B2 | 11/2017 | Hattori | |
| 9,892,949 B2 | 2/2018 | Nakagawa et al. | |
| 2004/0189963 A1* | 9/2004 | Ohsaki ................ | G03F 7/70925 355/53 |
| 2009/0108483 A1* | 4/2009 | Suehira ................. | G03F 9/7088 264/40.5 |
| 2011/0141489 A1* | 6/2011 | Sato ....................... | B29C 59/002 356/618 |
| 2011/0206852 A1* | 8/2011 | Shiode ................... | B82Y 10/00 427/356 |

(Continued)

FOREIGN PATENT DOCUMENTS

| | | |
|---|---|---|
| JP | 2008504141 A | 2/2008 |
| JP | 2010098310 A | 4/2010 |

(Continued)

*Primary Examiner* — Timothy Kennedy
(74) *Attorney, Agent, or Firm* — Rossi, Kimms & McDowell LLP

(57) ABSTRACT

The present invention provides an imprint apparatus that forms a pattern of an imprint material on a substrate by using a mold, the apparatus including a control unit configured to control a driving unit and a deformation unit such that parts of position control of controlling the relative positions of the mold and the substrate, and shape control of deforming at least one of the mold and the substrate are performed concurrently, wherein the control unit includes an input unit configured to give, to target position data, time-series data representing relative positions of the mold and the substrate that change at each time during which the shape control is performed in accordance with deformation in at least one of the mold and the substrate by the deformation unit.

20 Claims, 10 Drawing Sheets

(56) References Cited

U.S. PATENT DOCUMENTS

| | | | | |
|---|---|---|---|---|
| 2011/0278768 A1* | 11/2011 | Sato | G03F 9/7076 | 264/406 |
| 2012/0251725 A1* | 10/2012 | Aritsuka | B29C 43/58 | 427/277 |
| 2013/0234019 A1* | 9/2013 | Miyamoto | G03F 9/7003 | 250/306 |
| 2014/0209565 A1* | 7/2014 | Nakamura | B29C 33/58 | 216/41 |
| 2014/0320842 A1* | 10/2014 | Sato | G03F 7/0002 | 355/77 |
| 2014/0353865 A1* | 12/2014 | Nishikawara | G03F 7/0002 | 264/40.6 |
| 2015/0008605 A1* | 1/2015 | Sato | G03F 7/0035 | 264/40.1 |
| 2015/0076724 A1* | 3/2015 | Sato | G03F 9/7065 | 264/40.1 |
| 2015/0108674 A1* | 4/2015 | Murakami | G03F 7/0002 | 264/40.6 |
| 2015/0123312 A1* | 5/2015 | Nakano | G03F 7/0002 | 264/293 |
| 2015/0146215 A1* | 5/2015 | Kobayashi | G01B 11/2513 | 356/610 |
| 2015/0352756 A1* | 12/2015 | Yamaguchi | G03F 7/0002 | 264/40.4 |
| 2016/0202620 A1* | 7/2016 | Egashira | G03F 9/7092 | 438/14 |

FOREIGN PATENT DOCUMENTS

| | | |
|---|---|---|
| JP | 2011124346 A | 6/2011 |
| JP | 2013026288 A | 2/2013 |
| JP | 2013102137 A | 5/2013 |
| JP | 2014229881 A | 12/2014 |
| WO | 2005121892 A2 | 12/2005 |

* cited by examiner

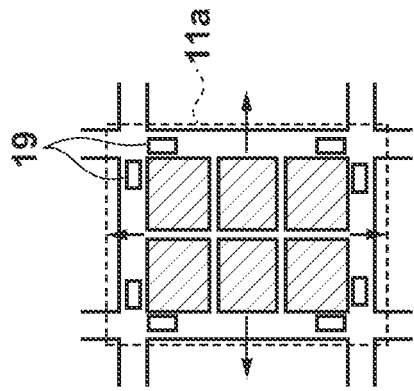
F I G. 4A
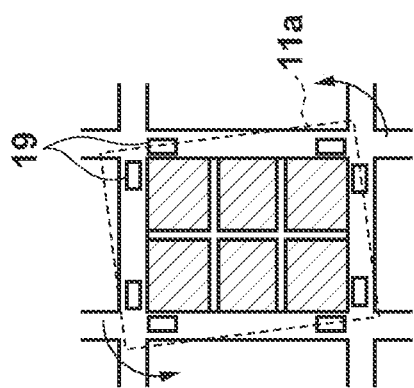
F I G. 4B
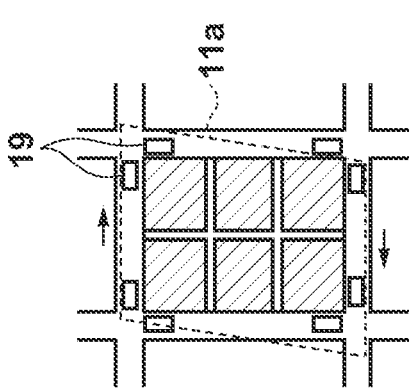
F I G. 4C
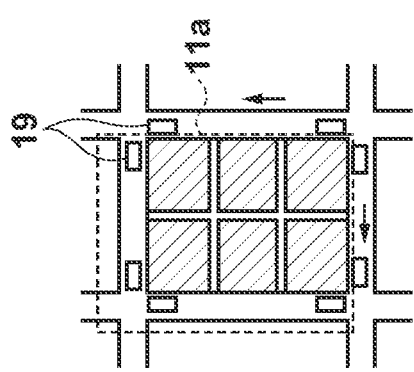
F I G. 4D
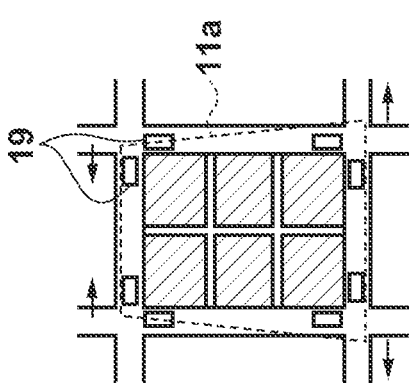
F I G. 4E

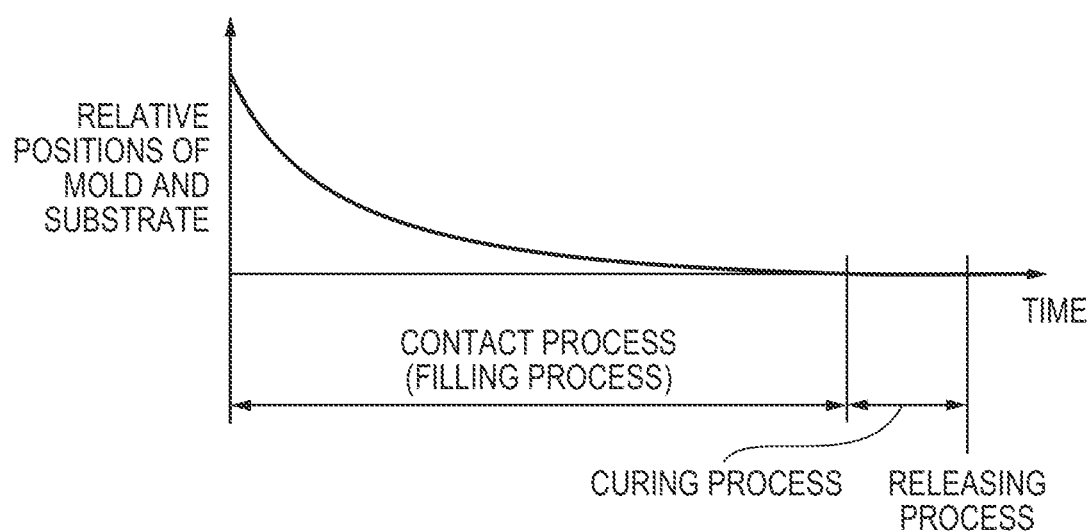

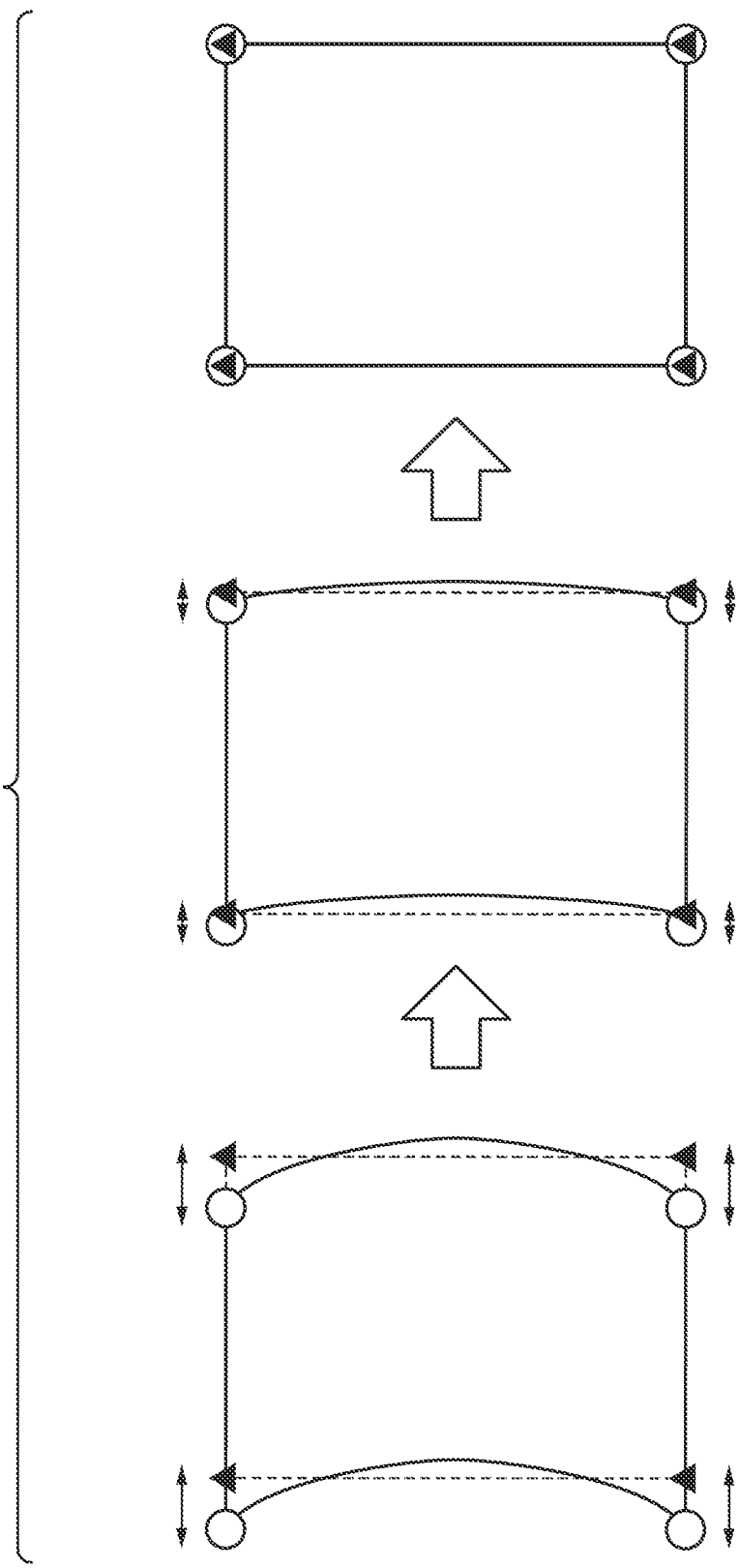

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique of enabling the transfer of a nano-scale fine pattern and has been proposed by Japanese Patent Laid-Open No. 2010-98310 as a mass-production nanolithography technique for devices such as semiconductor devices and magnetic storage media. An imprint apparatus using an imprint technique cures an imprint material on a substrate while a mold on which a pattern is formed is in contact with the imprint material, and forms the pattern on the substrate by releasing the mold from the cured imprint material. In this case, as an imprint material curing method, a photo-curing method is generally used, which cures an imprint material by irradiation with light such as ultraviolet light.

The imprint apparatus generally uses die-by-die alignment as an alignment scheme between a mold and a substrate. Die-by-die alignment is an alignment scheme of correcting a position deviation between a mold and a substrate by detecting marks provided on the mold and marks provided on the substrate for each shot region on the substrate.

When using an imprint apparatus, in order to maintain the performance of a device, it is necessary to accurately transfer a pattern on a mold onto a pattern (shot region of a substrate) on a substrate. In this case, in general, the shape of the pattern on the mold is matched with the shape of the pattern on the substrate. For example, a correction mechanism which deforms the pattern on the mold by pushing and pulling its peripheral portion, that is, a correction mechanism which corrects the shape of a pattern is proposed in Japanese Patent Laid-Open No. 2008-504141.

A technique of generating a heat distribution by irradiating a mold and a substrate with light, and controlling expansion of the mold and substrate for each region in order to match the shape of a pattern on the mold and the shape of a pattern on the substrate is also proposed in Japanese Patent Laid-Open No. 2013-102137. Furthermore, a technique of adding a shift component generated by expansion of a substrate to an alignment measurement value when a heat distribution is generated on the substrate to correct the shape of a pattern on the substrate is also proposed in Japanese Patent Laid-Open No. 2014-229881.

Correction of the position deviation by die-by-die alignment and correction of a shape shift by various methods are performed in almost the same time zone between bringing a mold into contact with an imprint material on a substrate and releasing the mold from a cured imprint material on the substrate in order to increase the productivity. Therefore, the respective correction operations influence each other, which may become a disadvantage in matching the shape of the pattern on the mold and the shape of the pattern on the substrate.

SUMMARY OF THE INVENTION

The present invention provides an imprint apparatus advantageous in terms of overlay accuracy between a mold and a substrate.

According to one aspect of the present invention, there is provided an imprint apparatus that forms a pattern of an imprint material on a substrate by using a mold, the apparatus including a measurement unit configured to obtain position data by measuring relative positions of the mold and the substrate, a driving unit configured to drive at least one of the mold and the substrate, a deformation unit configured to deform at least one of the mold and the substrate, and a control unit configured to control the driving unit and the deformation unit such that parts of position control of controlling the relative positions of the mold and the substrate, and shape control of deforming at least one of the mold and the substrate are performed concurrently, wherein the control unit controls the driving unit based on position data obtained by the measurement unit, and target position data representing relative target positions of the mold and the substrate, and includes an input unit configured to give, to the target position data, time-series data representing relative positions of the mold and the substrate that change at each time during which the shape control is performed in accordance with deformation in at least one of the mold and the substrate by the deformation unit.

Further aspects of the present invention will become apparent from the following description of exemplary embodiments with reference to the attached drawings.

BRIEF DESCRIPTION OF THE DRAWINGS

FIGS. 4A to 4E are views showing the deviations between the pattern surface of a mold and a shot region of a substrate.

FIG. 5 is a graph for explaining correction of a position deviation between the mold and the substrate by die-by-die alignment.

FIG. 6 shows views for explaining a change in relative positions of the mold and the substrate that occurs when the pattern surface of the mold and the shot region of the substrate are deformed.

DESCRIPTION OF THE EMBODIMENTS

Figure 1:
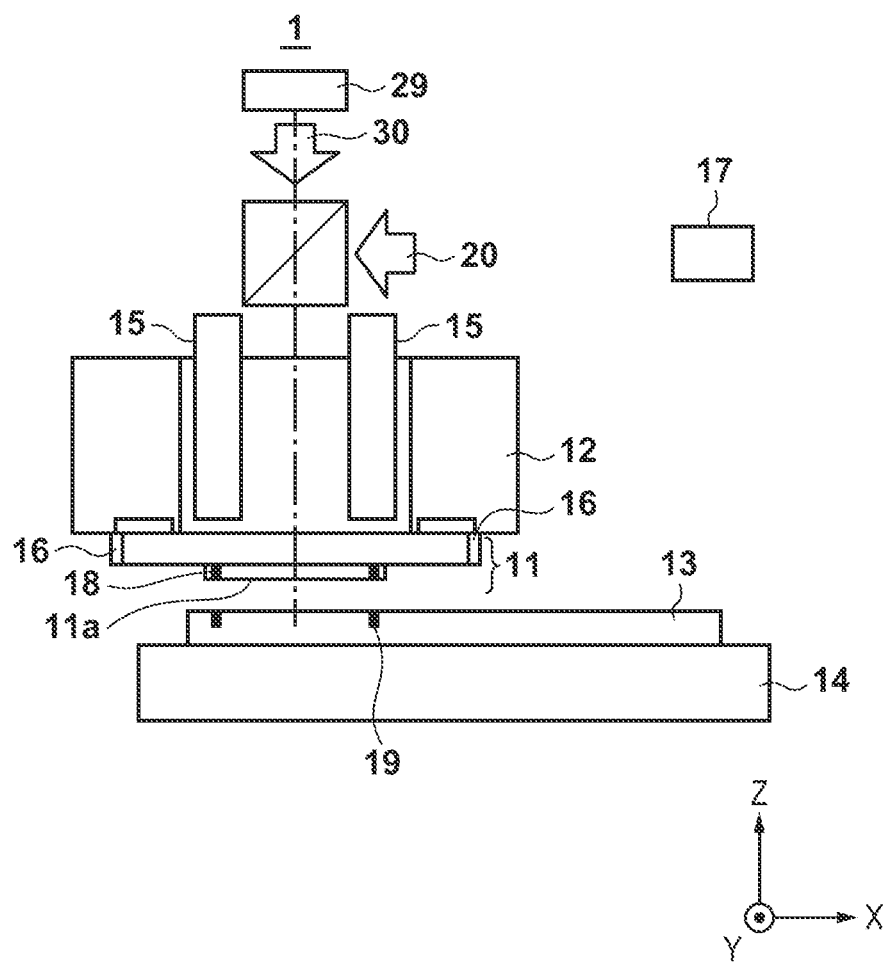
FIG. 1 is a schematic view showing the arrangement of an imprint apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 1 as an aspect of the present invention. The imprint apparatus 1 is a lithography apparatus that is used for manufacturing a semiconductor device or the like as an article and forms an imprint material pattern on a substrate by using a mold. In this embodiment, the imprint apparatus 1 brings an imprint material supplied onto the substrate and a mold into contact with each other and applies a curing energy to the imprint material to form a cured material pattern on which a concave-convex pattern of a mold is transferred.

An imprint material to be used includes a curable composition (also sometimes called an uncured resin) which is cured by application of curing energy. Curing energy to be used includes an electromagnetic wave and heat. An electromagnetic wave to be used includes, for example, light such as infrared light, visible light, or ultraviolet light selected from the wavelength range of 10 nm or more to 1 mm or less.

A curable composition is a composition which is cured by irradiation with light or application of heat. A curable composition which is cured by irradiation with light contains at least a polymerizable compound and a photopolymerization initiator, and may contain a nonpolymerizable compound or solvent as needed. A nonpolymerizable compound is at least one type of compound selected from the group consisting of a sensitizer, a hydrogen donor, an internal mold release agent, a surfactant, an antioxidant, and a polymer component.

An imprint material may be supplied in a film form onto a substrate by a spin coater or slit coater. Alternatively, an imprint material may be supplied by a liquid jet head in a droplet form, an island form with droplets being chained together, or a film form onto a substrate. The viscosity (at 25° C.) of the imprint material is 1 mPa·s or more to 100 mPa·s or less.

A substrate to be used is made of glass, ceramic, a metal, a semiconductor, and a resin. A member formed from a material different from a substrate may be formed on its surface, as needed. More specifically, a substrate to be used includes a silicon wafer, a compound semiconductor wafer, and a silica glass wafer.

The imprint apparatus 1 adopts a photocuring method as the curing method of the imprint material. The imprint apparatus 1 includes a mold holding unit 12 which holds a mold 11, a substrate holding unit 14 which holds a substrate 13, measurement units 15, shape correction units 16, and a control unit 17. In addition, the imprint apparatus 1 includes a supply unit including a dispenser for supplying an imprint material onto a substrate, a bridge surface plate for holding the mold holding unit 12, and a base surface plate for holding the substrate holding unit 14. In this embodiment, the mold holding unit 12 and the substrate holding unit 14 function as driving units which drive at least one of the mold 11 and the substrate 13. The shape correction units 16 and a thermal correction unit 29 function as deformation units which deform at least one of the mold 11 and the substrate 13.

The mold 11 has a rectangular outer shape and has a pattern surface 11a on which a pattern (convex-concave pattern) to be transferred onto the substrate 13 (an imprint material on it) is formed. The mold 11 is formed from a material which transmits ultraviolet light 20 for curing an imprint material on a substrate, for example, quartz. Mold-side marks 18 are formed on the pattern surface 11a of the mold 11.

The mold holding unit 12 is a holding mechanism which holds the mold 11. The mold holding unit 12 includes, for example, a mold chuck which vacuum-chucks or electrostatically chucks the mold 11, a mold stage on which the mold chuck is mounted, and a driving system which drives (moves) the mold stage. This driving system drives the mold stage (that is, the mold 11) at least in the z-axis direction (the direction (imprint direction) in which the mold 11 is brought into contact with an imprint material on a substrate). The driving system may have a function of driving the mold stage in the x-axis direction, the y-axis direction, and the θ (rotation about the z-axis) direction as well as the z-axis direction.

The substrate 13 is a substrate onto which a pattern on the mold 11 is transferred. The supply unit supplies (applies) an imprint material to the substrate 13. Substrate-side marks 19 are respectively formed on a plurality of shot regions of the substrate 13.

The substrate holding unit 14 is a holding mechanism which holds the substrate 13. The substrate holding unit 14 includes, for example, a substrate chuck which vacuum-chucks or electrostatically chucks the substrate 13, a substrate stage on which the substrate chuck is mounted, and a driving system which drives (moves) the substrate stage. This driving system drives the substrate stage (that is, the substrate 13) at least in the x-axis direction and the y-axis direction (the directions perpendicular to the imprint direction of the mold 11). The driving system may have a function of driving the substrate stage in the z-axis direction and the θ (rotation about the z-axis) direction as well as the x-axis direction and the y-axis direction.

Each measurement unit 15 includes a scope which optically detects (observes) each mold-side mark 18 provided on the mold 11 and a corresponding one of the substrate-side marks 19 provided on each of a plurality of shot regions of the substrate 13. Each measurement unit 15 obtains position data by measuring the relative positions (position deviation) of the mold 11 and the substrate 13 based on the detection result obtained by this scope. Note however that each measurement unit 15 is required only to detect the relative positions of each mold-side mark 18 and the corresponding substrate-side mark 19. Each measurement unit 15 may therefore include a scope including an optical system for simultaneously capturing images of two marks or a scope which detects a signal reflecting relative positions such as an interference signal or moire originating from two marks. In addition, each measurement unit 15 may not be capable of simultaneously detecting each mold-side mark 18 and the corresponding substrate-side mark 19. For example, each measurement unit 15 may obtain the positions of each mold-side mark 18, arranged inside and corresponding to a reference position, and the corresponding substrate-side mark 19 to detect the relative positions of the mold-side mark 18 and the substrate-side mark 19.

Figure 2:
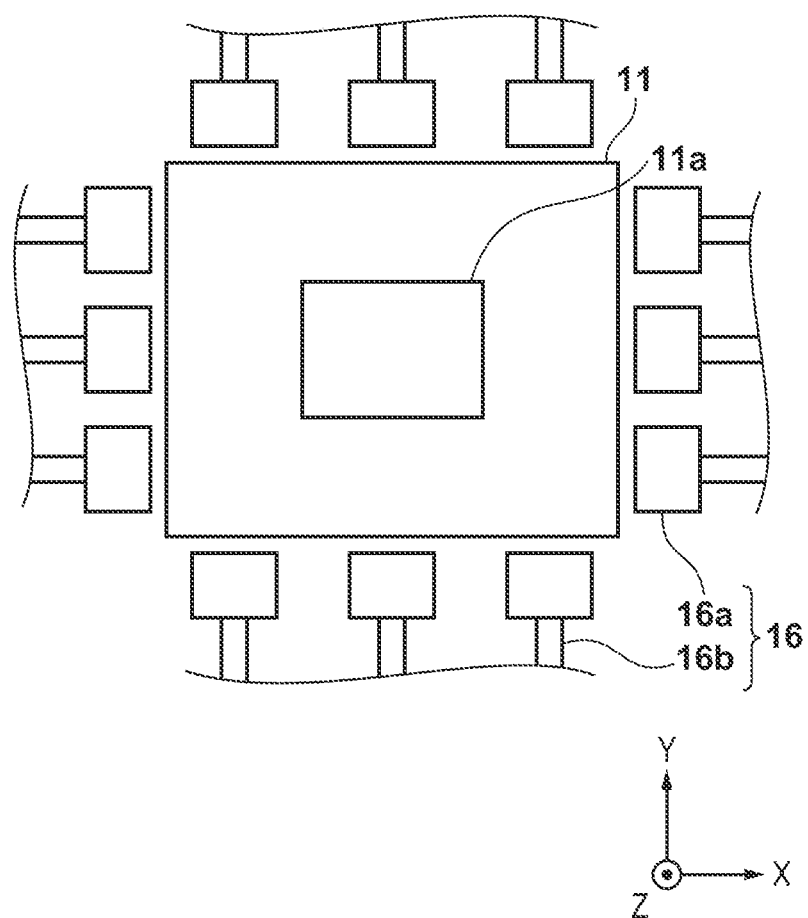
FIG. 2 is a view showing an example of the arrangement of the shape correction unit of the imprint apparatus shown in FIG. 1.

The shape correction units 16 correct the difference in shape (shape difference) between the shape of a pattern on the mold 11 and each shot region of the substrate 13 in order to match the shape of the pattern on the mold 11 and each shot region of the substrate 13. In this embodiment, the shape correction units 16 correct the shape of the pattern surface 11a by deforming the mold 11 (pattern surface 11a) by applying a force to the mold 11 in a direction parallel to the pattern surface 11a. For example, as shown in FIG. 2, the shape correction units 16 include chuck units 16a which chuck the side surfaces of the mold 11 and actuators 16b which drive the chuck units 16a in a direction to move toward the side surfaces of the mold 11 and a direction to move away from the side surfaces of the mold 11. Each chuck unit 16a may not have a function of chucking a side surface of the mold 11 and may be a contact member which comes into contact with a side surface of the mold 11. Note however that the shape correction units 16 may deform the pattern surface 11*a* by applying heat to the mold 11 and controlling the temperature of the mold 11.

The thermal correction unit 29 corrects the shape of a shot region of the substrate 13 (the pattern formed on the substrate 13) by locally thermally expanding the substrate 13 by irradiating the substrate at a predetermined position with light having constant intensity instead of deforming the pattern surface 11*a* of the mold 11. The thermal correction unit 29 corrects the shape of a shot region of the substrate 13 by irradiating the shot region with light 30 and using a difference in degree of thermal expansion between the mold 11 and the substrate 13 with high degree of freedom. The thermal correction unit 29 includes an element capable of changing the irradiation position of the light 30 on the substrate slightly, for example, a DMD (Digital Micromirror Device). The thermal correction unit 29 controls (adjusts) the DMD so as to irradiate a region on the substrate to be deformed largely with more light 30 and to irradiate a region on the substrate not to be deformed so much with less light 30. This generates a heat distribution on the substrate, making it possible to deform the shot region of the substrate 13.

The control unit 17 includes a CPU and a memory and controls the overall imprint apparatus 1 (the respective units of the imprint apparatus 1). In this embodiment, the control unit 17 controls the imprint process and related processes. For example, the control unit 17 performs alignment between the mold 11 and the substrate 13 based on the measurement result obtained by the measurement unit 15 when performing the imprint process. In addition, when performing the imprint process, the control unit 17 controls the deformation amount of the pattern surface 11*a* of the mold 11 by the shape correction units 16 and the deformation amount of the shot region of the substrate 13 by the thermal correction unit 29. In this case, the mold holding unit 12, the substrate holding unit 14, the shape correction units 16, and the thermal correction unit 29 are controlled such that parts of position control of controlling the relative positions of the mold 11 and the substrate 13, and shape control of deforming at least one of the mold 11 and the substrate 13 are performed concurrently.

Each mold-side mark 18 and the corresponding substrate-side mark 19 serving as alignment marks used for alignment between the mold 11 and the substrate 13 will be described with reference to FIGS. 3A and 3B. Assume that in this embodiment, six chip regions are arranged in one shot region of the substrate 13.

Figure 3A:
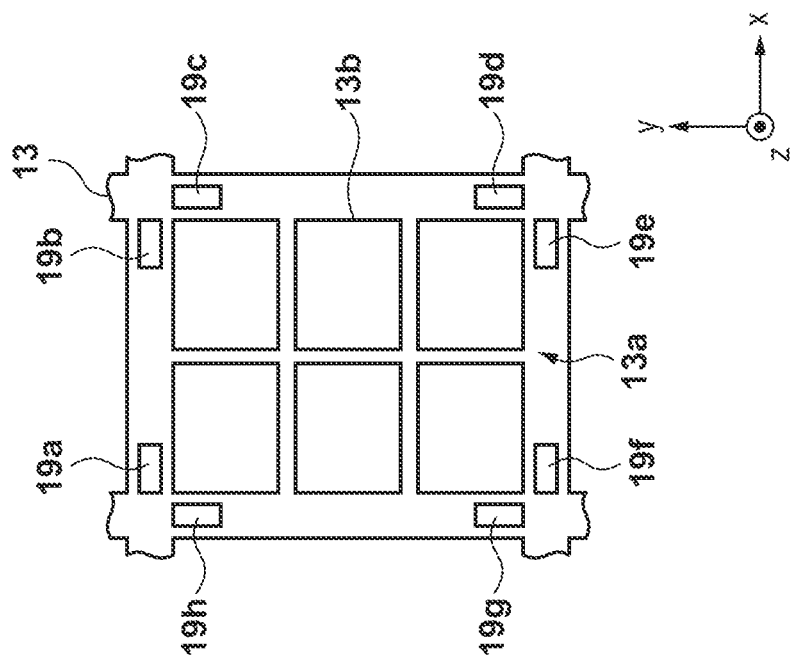
FIGS. 3A and 3B are views showing an example of mold-side marks provided on a mold and substrate-side marks provided on a substrate.

FIG. 3A shows the pattern surface 11*a* of the mold 11, more specifically, mold-side marks 18*a* to 18*h* provided on the four corners of the pattern surface 11*a*. Referring to FIG. 3A, the mold-side marks 18*a*, 18*b*, 18*e*, and 18*f*, each having a longitudinal direction in the horizontal direction, are marks each having a measurement direction in the x-axis direction. In contrast, the mold-side marks 18*c*, 18*d*, 18*g*, and 18*h*, each having a longitudinal direction in the vertical direction, are marks each having a measurement direction in the y-axis direction. In addition, referring to FIG. 3A, the regions enclosed by the dotted lines indicate pattern regions 11*b* in which patterns to be respectively transferred onto the six chip regions of the substrate described above are formed.

Figure 3B:
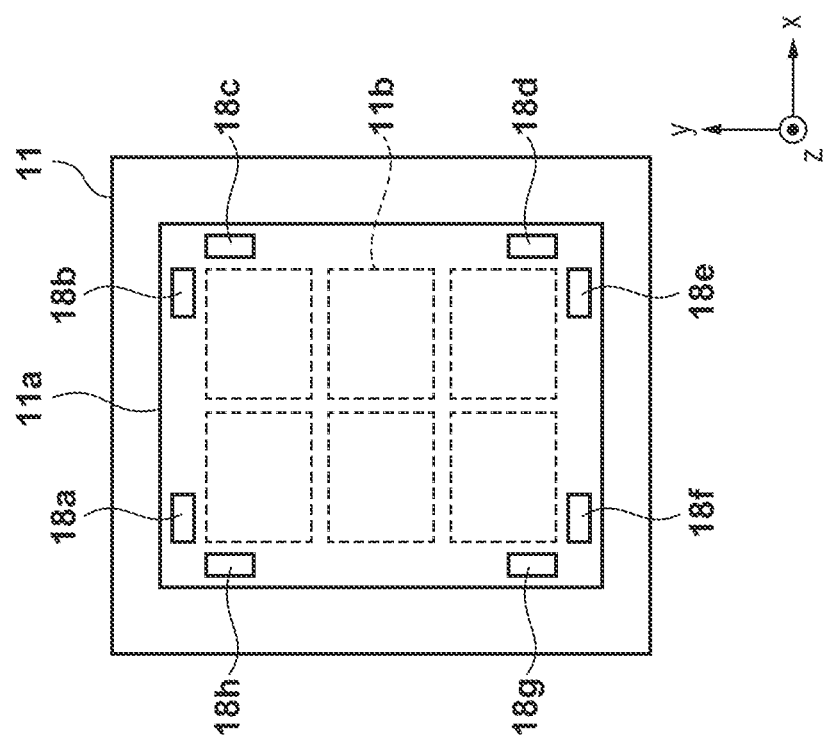

FIG. 3B shows substrate-side marks 19*a* to 19*h* provided on the periphery of one shot region 13*a* of the substrate 13, more specifically, the four corners of the shot region 13*a*. Referring to FIG. 3B, the substrate-side marks 19*a*, 19*b*, 19*e*, and 19*f*, each having a longitudinal direction in the horizontal direction, are marks each having a measurement direction in the x-axis direction. In contrast, the substrate-side marks 19*c*, 19*d*, 19*g*, and 19*h*, each having a longitudinal direction in the vertical direction, are marks each having a measurement direction in the y-axis direction. In addition, referring to FIG. 3B, the regions enclosed by the solid lines inside the shot region 13*a* are chip regions 13*b*.

When the imprint process is to be performed, that is, the mold 11 is made to respectively come into contact with the imprint material on the substrate, the mold-side marks 18*a* to 18*h* provided on the mold 11 are made to come close to the substrate-side marks 19*a* to 19*h* provided on the substrate 13. It is therefore possible to compare the position and shape of the pattern surface 11*a* of the mold 11 with those of the shot region 13*a* of the substrate 13 by detecting the mold-side marks 18 and the substrate-side marks 19 using the measurement units 15. If differences (deviations) occur between the position and shape of the pattern surface 11*a* of the mold 11 and those of the shot region 13*a* of the substrate 13, the overlay accuracy deteriorates, resulting in transfer failure (product failure) in the pattern.

FIGS. 4A to 4E are views showing the deviations between the position and shape of the pattern surface 11*a* of the mold 11 and those of the shot region 13*a* of the substrate 13 (to be referred to as "the deviations between the mold 11 and the shot region 13*a*" hereinafter). The deviations between the mold 11 and the shot region 13*a* include a shift, a magnification deviation, and a rotation. Detecting a relative position deviation (position deviation amount) of the mold-side mark 18 relative to the substrate-side mark 19 makes it possible to estimate that the deviation between the mold 11 and the shot region 13*a* is a shift, a magnification deviation, or a rotation.

FIG. 4A shows a case in which the deviation between the mold 11 and the shot region 13*a* is a shift. Detecting that each mold-side mark 18 deviates from the corresponding substrate-side mark 19 in one direction can estimate that the deviation between the mold 11 and the shot region 13*a* is a shift.

FIG. 4B shows a case in which the deviation between the mold 11 and the shot region 13*a* is a rotation. If the deviation direction of each mold-side mark 18 differs between the upper, lower, left, and right sides of the shot region 13*a* so as to draw a circle centered on a given point in the shot region, it can be estimated that the deviation between the mold 11 and the shot region 13*a* is a rotation.

FIG. 4C shows a case in which the deviation between the mold 11 and the shot region 13*a* is a magnification deviation. If it is detected that each mold-side mark 18 uniformly deviates inward or outward with respect to the center of the shot region 13*a*, it can be estimated that the deviation between the mold 11 and the shot region 13*a* is a magnification deviation.

FIG. 4D shows a case in which the deviation between the mold 11 and the shot region 13*a* is a trapezoidal deviation. If it is detected that each mold-side mark 18 deviates inward or outward with respect to the center of the shot region 13*a* and the direction differs between the upper and lower sides or the left and right sides of the shot region 13*a*, it can be estimated that the deviation between the mold 11 and the shot region 13*a* is a trapezoidal deviation. In addition, if it is detected that each mold-side mark 18 deviates inward or outward with respect to the center of the shot region 13*a* and the deviation amount differs between the upper and lower sides or the left and right sides of the shot region 13*a*, it can be estimated that the deviation between the mold 11 and the shot region 13*a* is a trapezoidal deviation.

FIG. 4E shows a case in which the deviation between the mold 11 and the shot region 13a is a twist. If it is detected that the deviation direction for each mold-side mark 18 differs between the upper and lower sides or the left and right sides of the shot region 13a, it can be estimated that the deviation between the mold 11 and the shot region 13a is a twist.

As shown in FIGS. 4C to 4E, if the deviation between the mold 11 and the shot region 13a is a magnification deviation, trapezoidal deviation, twist, or the like, the control unit 17 causes the shape correction units 16 to deform the shape of the pattern surface 11a of the mold 11. Although not shown, even if the deviation between the mold 11 and the shot region 13a is an arched deviation, barrel deviation, pincushion deviation, or the like, the control unit 17 causes the shape correction units 16 to deform the shape of the pattern surface 11a of the mold 11. More specifically, the control unit 17 controls the deformation amount of the pattern surface 11a by the shape correction units 16 so as to match the shape of the pattern surface 11a of the mold 11 with the shape of the shot region 13a of the substrate 13. The control unit 17 obtains in advance data representing the correspondence relationship between the driving amount of each actuator 16b (that is, the force applied to the mold 11) and the deformation amount of the pattern surface 11a and stores the data in a memory or the like. The control unit 17 obtains the deformation amount (the degree of deformation of the pattern surface 11a) which is required to match the shape of the pattern surface 11a with the shape of the shot region 13a based on the measurement result obtained by each measurement unit 15. The control unit 17 then obtains the driving amount of each actuator 16b which corresponds to the obtained deformation amount of the pattern surface 11a from the data stored in the memory, and drives the actuator 16b.

In this manner, the imprint apparatus 1 transfers a pattern on the mold 11 onto an imprint material on a substrate while correcting the alignment between the mold 11 and the substrate 13 (shot region 13a), and the shapes of the mold 11 (pattern surface 11a) and the substrate 13 (shot region).

Correction of a position deviation between the mold 11 and the substrate 13 by die-by-die alignment (position control of controlling the relative positions of the mold 11 and the substrate 13) will be described with reference to FIG. 5. In FIG. 5, the ordinate indicates the relative positions of the mold 11 and the substrate 13, and the abscissa indicates a time in the imprint process. The imprint process includes a supply process of supplying the imprint material onto the substrate, a contact process of bringing the mold 11 and the imprint material on the substrate into contact with each other, and a filling process of filling the pattern of the mold 11 with the imprint material. The imprint process further includes a curing process of curing the imprint material and a releasing process of releasing the mold 11 from the cured imprint material. Correction of the position deviation between the mold 11 and the substrate 13 mainly means relative alignment in a direction (shift) and rotation along a substrate surface between the mold 11 and the substrate 13.

In the imprint apparatus 1, the imprint material on the substrate is cured by irradiating the imprint material with the ultraviolet light 20 via the mold 11 after the pattern of the mold 11 is filled with the imprint material on the substrate by bringing the mold 11 and the imprint material into contact with each other. Then, the pattern of the mold 11 is transferred by releasing the mold 11 from the cured imprint material on the substrate. In the imprint apparatus 1, correction of the position deviation between the mold 11 and the substrate 13 by die-by-die alignment is generally performed concurrently with the filling process of filling the pattern of the mold 11 with the imprint material in order to suppress a reduction in productivity.

As shown in FIG. 5, after the mold 11 and the imprint material on the substrate are brought into contact with each other, based on the relative positions of the mold 11 and the substrate 13 measured by the measurement units 15, the substrate holding unit 14 or the mold holding unit 12 is driven so as to reduce a deviation between the mold 11 and the substrate 13. FIG. 5 shows a state in which final driving of the substrate holding unit 14 or mold holding unit 12 is performed gradually so that the deviation amount between the relative positions of the mold 11 and the substrate 13 is set at zero (a position where the mold 11 and the shot region of the substrate 13 overlap completely) as time goes by.

In correction of the position deviation between the mold 11 and the substrate 13, based on only the relative positions of the mold 11 and the substrate 13 measured in the early stage of the contact process of bringing the mold 11 and the imprint material on the substrate into contact with each other, it is also possible to set the deviation amount between the relative positions of the mold 11 and the substrate 13 at zero. As shown in FIG. 5, however, it is preferable that measurement of the relative positions of the mold 11 and the substrate 13, and driving of the substrate holding unit 14 or mold holding unit 12 are repeated to gradually drive the mold 11 and the shot region of the substrate 13 into the position where they overlap completely. This makes it possible to cope with an irregular situation in which, for example, the mold 11 deviates with respect to the mold holding unit 12, measurement results of the measurement units 15 are deceived by a delay in filling the mold-side marks 18 with the imprint material, or the like. It is therefore possible to converge correction of the position deviation between the mold 11 and the substrate 13 in a short time.

A change in relative positions (relative position deviation component) of the mold 11 and the substrate 13 that occurs in a case in which the pattern surface 11a of the mold 11 is deformed by the shape correction units 16 or in a case in which the shot region of the substrate 13 is deformed by the thermal correction unit 29 will be described with reference to FIG. 6. FIG. 6 shows a state in which the pattern surface 11a of the mold 11 or the shot region of the substrate 13 is deformed gradually. A case in which a deviation between the mold 11 and the shot region of the substrate 13 is an arched deviation will be described here.

In die-by-die alignment, relative alignment in the shift and rotation between the mold 11 and the substrate 13 is generally performed by using a result obtained by measuring a plurality of measurement points. In FIG. 6, a shape of the pattern surface 11a of the mold 11 or the shot region of the substrate 13 before correction (before deformation) is indicated by a solid line, and positions of four measurement points by the measurement units 15 before correction are indicated by open circles. Moreover, a shape of the pattern surface 11a of the mold 11 or the shot region of the substrate 13 after correction (after deformation) is indicated by a dotted line, and positions of four measurement points by the measurement units 15 after correction are indicated by filled triangles.

Referring to FIG. 6, if die-by-die alignment is performed when an arched deviation occurs, only relative positions of the mold 11 and the substrate 13 at the measurement points are used, causing a divergence in overall alignment between the pattern surface 11a and the shot region. To cope with this, by adding deformation in the pattern surface 11a of the mold 11 or the shot region of the substrate 13 to such die-by-die alignment, it is possible to overlay the positions and shapes of the pattern surface 11a and the shot region.

However, the relative positions of the mold 11 and the substrate 13 change by deforming the pattern surface 11a of the mold 11 or the shot region of the substrate 13. Therefore, extra driving of the mold holding unit 12 or substrate holding unit 14 becomes unnecessary if a change in relative positions of the mold 11 and the substrate 13 caused by deforming the pattern surface 11a of the mold 11 or the shot region of the substrate 13 is considered in die-by-die alignment.

In accordance with the progression (progress) of shape control of deforming the pattern surface 11a of the mold 11 or the shot region of the substrate 13, the relative positions of the mold 11 and the substrate 13 change at each time during which the shape control is performed. Therefore, the change in relative positions of the mold 11 and the substrate 13 caused by the shape control concerning the mold 11 or the substrate 13 needs to be considered not as a fixed offset but as a variable offset.

Furthermore, upon reception of an input from each shape correction unit 16 or the thermal correction unit 29, actual deformation in the pattern surface 11a of the mold 11 or the shot region of the substrate 13 does not always change linearly with respect to a time. For example, concerning the mold 11 or the substrate 13, a phenomenon in which it is deformed abruptly after exceeding a predetermined threshold (deformation amount) is often confirmed.

In this embodiment, although the shape correction units 16 apply forces to the side surfaces of the mold 11, there exists a case in which a region deformed linearly and a region deformed nonlinearly coexist on the pattern surface 11a of the mold 11, or a case in which the pattern surface 11a is deformed nonlinearly. Concerning the thermal correction unit 29 as well, there exists a case in which the shot region is deformed nonlinearly because deformation in shot shape with respect to a time may change before and after a heat amount to be a threshold is added depending on the structure of the substrate 13.

Note that the shape control of deforming the pattern surface 11a of the mold 11 or the shot region of the substrate 13 may be performed based on shape difference data obtained in advance, which represents a shape difference between the pattern surface 11a and the shot region. For example, a mold-side pattern shape (the shape of the pattern surface 11a) is measured by an external measurement device capable of fine measurement and stored. Next, a shape difference to be corrected may be captured by measuring a substrate-side pattern shape (the shape of the shot region) using an external measurement device capable of fine measurement, and matching (comparing) measurement data on the mold-side pattern shape with measurement data on the substrate-side pattern shape. Global measurement of the substrate 13 reduces productivity. To prevent this, the shapes of the substrates 13 created in the same process are stable, and thus some of the substrates 13 may be taken out to be measured. In this case, a correction amount of the pattern shape is grasped before an imprint process (before mark measurement), and thus it is possible to start correction before the imprint process (before mark measurement).

In this case as well, using temporal deformation in relative positions of the mold 11 and the substrate 13 caused by the shape control concerning the mold 11 and the substrate 13 as a nonlinear component, it needs to be considered as an offset for position control of controlling the relative positions of the mold 11 and the substrate 13. If shape correction is performed in advance, the offset is considered by matching timings of the shape correction and position control. In this case, since the shape correction is being performed, just an addition as an initial offset of the position control is effective. Of course, a shape difference between a mold-side pattern and a substrate-side pattern may be measured in the imprint apparatus for each substrate. It is necessary, however, to perform measurement at many points in order to obtain a higher-order shape difference. Depending on accuracy needed, measurement in the imprint apparatus and measurement by an external measurement device may be used selectively, or both of them may be used.

Figure 7:
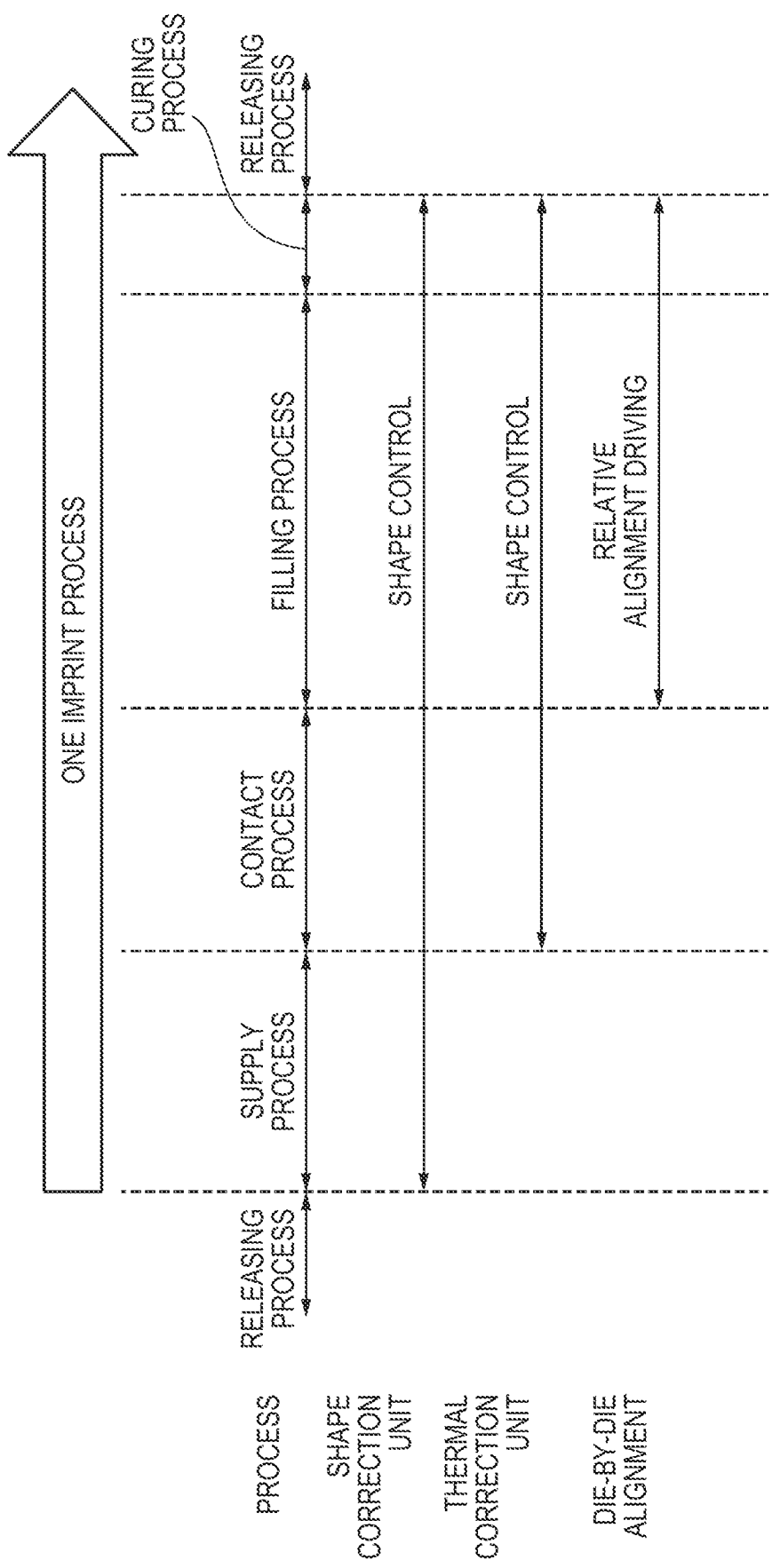
FIG. 7 is a chart for explaining a temporal relationship between die-by-die alignment and the sequence of shape control.

A temporal relationship between die-by-die alignment (the position control of controlling the relative positions of the mold 11 and the substrate 13) and the sequence of the shape control of deforming the pattern surface 11a of the mold 11 or the shot region of the substrate 13 will be described with reference to FIG. 7. As shown in FIG. 7, if the shape control is performed based on the shape difference data obtained in advance, the shape correction units 16 can perform the shape control from the end of the imprint process (releasing process) for a preceding shot region to the end of the curing process for a target shot region. The thermal correction unit 29 can also perform the shape control from time at which the mold 11 and the shot region of the substrate 13 face each other (from the start of the contact process) to the end of the curing process. Accordingly, at least a part of the sequence of the shape control is performed concurrently with the position control by die-by-die alignment. Note that if the shape control is performed based on the measurement results by the measurement units 15, a period from first measurement performed by the measurement units 15 to the end of the curing process after the start of the imprint process becomes a period in which the shape control is performed.

As described above, if the pattern surface 11a of the mold 11 or the shot region of the substrate 13 is deformed, the change in relative positions of the mold 11 and the substrate 13, more specifically, a change in shift component or rotation component occurs. The relative positions of the mold 11 and the substrate 13 change continuously until the end of the shape control, and thus the shift component or rotation component owing to the shape control also changes until the curing process. Therefore, if the position control is performed based on only the measurement results of the measurement units 15, the change in shift component or rotation control owing to the shape control is not considered. Consequently, the relative positions of the mold 11 and the substrate 13 are corrected excessively or insufficiently while measurement of the relative positions of the mold 11 and the substrate 13, and driving of the substrate holding unit 14 or mold holding unit 12 are repeated. This increases a time needed for the position control of controlling the relative positions of the mold 11 and the substrate 13 (relative alignment time), resulting in the reduction in productivity.

For example, if the relative positions of the mold 11 and the substrate 13 in the early stage of the contact process are equal to the relative positions of the mold 11 and the substrate 13 changed by the shape control, the mold holding unit 12 or the substrate holding unit 14 need not be driven. In the related art, however, the mold holding unit 12 or the substrate holding unit 14 is driven based on the relative positions of the mold 11 and the substrate 13 in the early stage of the contact process, and thus it becomes necessary to restore a change amount of the relative positions of the mold 11 and the substrate 13 owing to the shape control.

In this embodiment, even if parts of the position control of controlling the relative positions of the mold 11 and the substrate 13, and the shape control of deforming the pattern surface 11a of the mold 11 or the shot region of the substrate 13 are performed concurrently, a technique capable of performing the position control in a short time is provided.

A method of obtaining the shape difference data representing the shape difference between the pattern surface 11a of the mold 11 and the shot region of the substrate 13 will be described. If a difference in shot shape between substrates formed in the same process is small, it is possible to obtain the shape difference data by measuring the shape of the pattern surface 11a of the mold 11 in addition to measuring in advance the shot region of the substrate 13 by the external measurement device. It is also possible to obtain the shape difference data from a result obtained by actually performing the imprint process. It is more convenient to obtain a relative value of the shape of the shot region than to obtain an absolute value of the shape of the shot region. By storing the thus obtained shape difference data in a storage unit of the imprint apparatus 1, it is possible to instruct a shape correction amount when the imprint process is performed on each shot region of the substrate 13. If the shape control is performed based on the shape difference data obtained in advance as described above, it is possible to obtain, by simulations, the relative positions (a time-rate change thereof) of the mold 11 and the substrate 13 that change at each time during which the shape control is performed.

If the difference in shot shape between the substrates formed in the same process is large, it is possible to obtain the shape difference data by measuring the mold-side marks 18 and the substrate-side marks 19 using the measurement units 15 with respect to the respective shot regions of the respective substrates. Note that it is also possible to manage the progress of the shape control by measuring the mold-side marks 18 and the substrate-side marks 19 using the measurement units 15 during the shape control is performed. At this time, the number of marks (measurement points) to be measured by the measurement units 15 is set in accordance with a higher-order component item of a shape to be corrected by the shape control. The shape control may be performed based on a result obtained by thus measuring the mold-side marks 18 and the substrate-side marks 19 sequentially using the measurement units 15. In this case, the deformation in the pattern surface 11a of the mold 11 and the shot region of the substrate 13 can be made smaller along with the elapse of time, and thus it is possible to obtain a state in which they are deformed nonlinearly. Even if the number of measurement points by the measurement units 15 is small, by comparing in advance actual deformation in the pattern surface 11a of the mold 11 and the shot region of the substrate 13 with a simulation result, it is possible to obtain the state in which they are deformed.

The control unit 17 controls the shape correction units 16 and the thermal correction unit 29 based on the shape difference data. More specifically, the control unit 17 instructs the shape correction units 16 to apply a specific degree of a force to a specific portion of the mold 11. In addition, with respect to the thermal correction unit 29, the control unit 17 obtains a heat distribution needed to correct the shape difference and sets an irradiation amount distribution of the light 30 which irradiates the shot region of the substrate 13. At this time, the relative positions (the shift component or the rotation component) of the mold 11 and the substrate 13 that change at each time during which the shape control is performed in accordance with the deformation in the mold 11 or the substrate 13 are obtained, and reflected in the measurement results of the measurement units 15 or relative target positions of the mold 11 and the substrate 13. This makes it possible to suppress extra driving of the mold holding unit 12 or substrate holding unit 14 in the position control of controlling the relative positions of the mold 11 and the substrate 13, and thus it is possible to terminate the position control in a short time.

An example of the operation of the imprint apparatus 1 in this embodiment will be described. The control unit 17 controls the mold holding unit 12, the substrate holding unit 14, the shape correction units 16, and the thermal correction unit 29 such that the parts of the position control of controlling the relative positions of the mold 11 and the substrate 13, and the shape control of deforming the mold 11 or the substrate 13 are performed concurrently. In the position control, the mold holding unit 12 and the substrate holding unit 14 are controlled based on, for example, position data obtained by the measurement units 15 in the contact process, and target position data representing the relative target positions of the mold 11 and the substrate 13. The relative positions of the mold 11 and the substrate 13 for setting a relative position deviation amount of the mold 11 and the substrate 13 at zero are assumed as the target positions here.

In accordance with the deformation in the mold 11 or the substrate 13 in the shape control, the relative positions of the mold 11 and the substrate 13 also change temporally. Therefore, the relative positions of the mold 11 and the substrate 13 that change at each time during which the shape control is performed can be represented as, for example, a function f(t) of time. The function f(t) indicates a change in relative positions of the mold 11 and the substrate 13 that occurs during the shape control is performed, and is also time-series data representing the relative positions of the mold 11 and the substrate 13 that change at each time during which the shape control is performed. By applying (adding) the function f(t) to the target position data, driving of the mold holding unit 12 or substrate holding unit 14 in the position control is minimized. It is also possible to obtain the same effect by applying the function f(t) to the position data obtained by the measurement units 15.

The function f(t) indicates the change in relative positions of the mold 11 and the substrate 13 which is predicted based on a shape correction amount obtained from the shape difference between the pattern surface 11a of the mold 11 and the shot region of the substrate 13. The function f(t) can be obtained from position data obtained by measuring the relative positions of the mold 11 and the substrate 13 using the measurement units 15 while deforming the mold 11 or the substrate 13 by the shape correction units 16 and the thermal correction unit 29. It is also possible to obtain the function f(t) not from such actual measurement but from simulations. The function f(t) may be an approximation curve using time t in a polynomial as a variable, or may directly use a result obtained by the actual measurement or simulations. A component is represented as the function f(t) in a sense that it is a temporally changing value. However, the component changes in accordance with the shape control, and thus a force applied to the mold 11 by each shape correction unit 16, a light amount (heat) applied to the substrate 13 by the thermal correction unit 29, or an integrated amount thereof may be used as a variable.

Note that as in the related art, if the change in relative positions of the mold 11 and the substrate 13 that occurs during the shape control is performed is given to the target position data or the position data as a fixed offset, the position data obtained by the measurement units 15 also includes the change. In other words, the position data obtained by the measurement units 15 doubly includes the change in relative positions of the mold 11 and the substrate 13 that occurs during the shape control is performed. It is therefore impossible to minimize driving of the mold holding unit 12 or substrate holding unit 14 in the position control, making it difficult to perform the position control in a short time.

Figure 8:
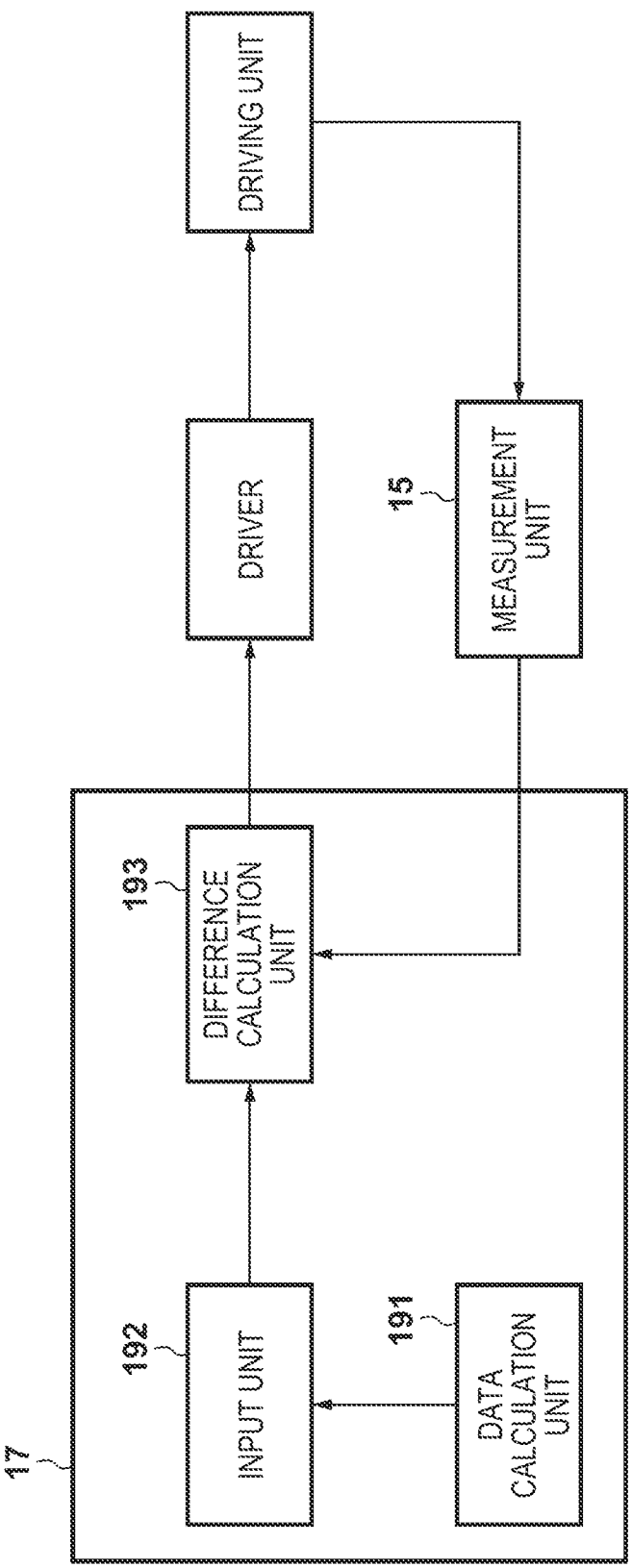
FIG. 8 is a block diagram showing an example of a control arrangement for implementing position control according to this embodiment.

FIG. 8 is a block diagram showing an example of a control arrangement for implementing position control according to this embodiment. In FIG. 8, the mold holding unit 12 and the substrate holding unit 14 are given as a driving unit collectively. The control unit 17 includes a data calculation unit 191, an input unit 192, and a difference calculation unit 193. The measurement unit 15 measures the relative positions of the mold 11 and the substrate 13 to obtain position data, and inputs the position data to the difference calculation unit 193.

The data calculation unit 191 obtains the time-series data (function f(t)) representing the relative positions of the mold 11 and the substrate 13 that change at each time during which the shape control is performed in accordance with the deformation in the mold 11 or substrate 13 in the shape control. The time-series data can be obtained from the position data obtained by measuring the relative positions of the mold 11 and the substrate 13 using the measurement units 15 while deforming the mold 11 or the substrate 13 by the shape correction units 16 and the thermal correction unit 29, as described above. Moreover, as described above, the time-series data represents the relative positions of the mold 11 and the substrate 13 that change nonlinearly at each time during which the shape control is performed, more specifically, at least one of a relative shift amount of the mold 11 and the substrate 13, and a relative rotation amount of the mold 11 and the substrate 13.

The input unit 192 inputs the time-series data obtained by the data calculation unit 191 to the difference calculation unit 193. Note that if the time-series data is stored in advance in the storage unit of the imprint apparatus 1, the input unit 192 may input the time-series data stored in the storage unit to the difference calculation unit 193.

The difference calculation unit 193 obtains difference data as a difference between the target position data and the position data input from the measurement units 15, and inputs the difference data to a driver of the driving unit. In this embodiment, however, the time-series data is input from the input unit 192 to the difference calculation unit 193. Therefore, the difference calculation unit 193 obtains, as difference data, a difference between the position data and target position data to which the time-series data is added or a difference between the target position data and position data to which the time-series data is added. The driver drives the driving unit of the mold holding unit 12 and substrate holding unit 14 based on the difference data input from the difference calculation unit 193.

Note that the time-series data input to the difference calculation unit 193 preferably includes at least one of the relative shift amount of the mold 11 and the substrate 13, and the relative rotation amount of the mold 11 and the substrate 13 in the early stage of the contact process. This makes it possible to perform the position control from a position near final relative positions of the mold 11 and the substrate 13, and thus it is possible to further shorten a time needed for the position control.

In the imprint apparatus 1, the mold 11 and the substrate 13 are driven in a direction parallel to the substrate surface while the mold 11 is in contact with the imprint material on the substrate, generating a shearing force between the mold 11 and the substrate 13. The magnitude of the shearing force is decided depending on various factors such as a force (imprint force) when the mold 11 is brought into contact with the imprint material on the substrate, the viscosity of the imprint material, and the shape of a pattern on the mold 11. If the shearing force is large, in the position control of the mold 11 and the substrate 13, for example, the shot region of the substrate 13 is deformed by driving the substrate 13.

Figure 9A:
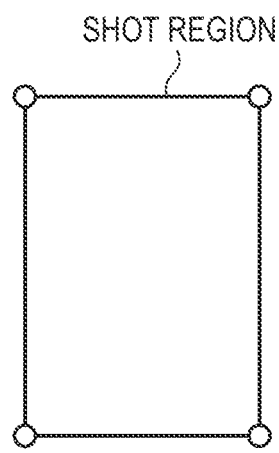
FIGS. 9A to 9C are views showing deformation in shape of a shot region of the substrate.
Figure 9B:
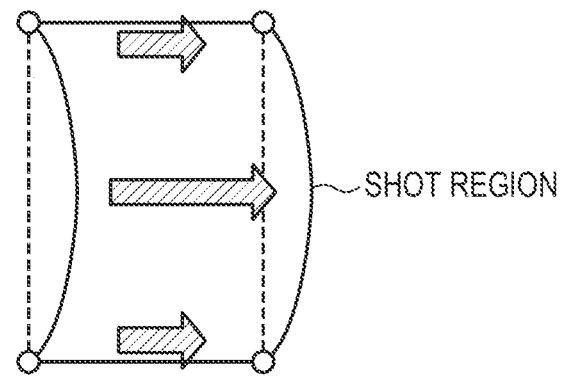

FIG. 9A shows the shape of a shot region before the substrate 13 is driven. FIG. 9B shows the shape of the shot region after the substrate 13 is driven. Referring to FIG. 9A, the shape of the shot region before the substrate 13 is driven is a rectangle. As shown in arrows in FIG. 9B, the influence of the shearing force is large because a contact area with the imprint material is large near the center of the shot region, and the influence of the shearing force is small because the contact area with the imprint material is small on the periphery of the shot region. By such a difference in magnitude of the shearing force, the shot region after the substrate 13 is driven is deformed into an arcuated shape. The relative positions (the shift component or the rotation component) of the mold 11 and the substrate 13 also change by such deformation in shape of the shot region. Note that deformation in shape of the shot region after the substrate 13 is driven changes depending on a driving direction, driving distance, or the like of the mold 11 or substrate 13.

In general, when a plurality of marks are measured, marks spaced apart from each other, for example, marks present on the four corners of the shot region are selected in order to improve the measurement accuracy of the rotation component or magnification component. As shown in FIG. 9B, a change in position of four marks indicated by open circles and the barycentric position of the shot region may be at different positions. For a device, the performance of the device is more stabilized as overlay accuracy is higher on average in the entire shot region. It is therefore preferable that the barycentric position of the pattern surface 11a of the mold 11 and the barycentric position of the shot region of the substrate 13 are matched.

Figure 9C:
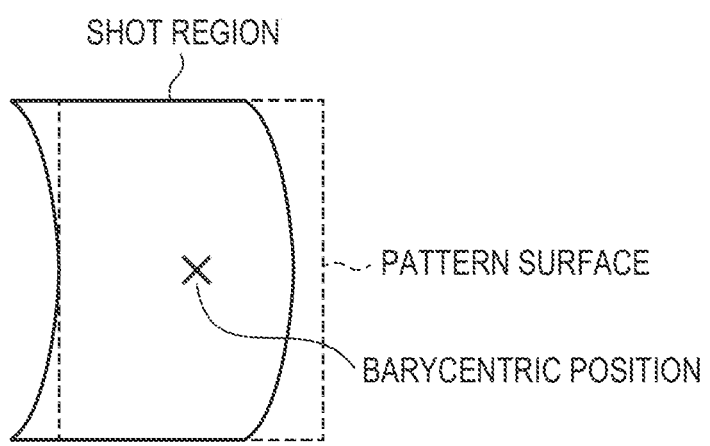

It is therefore preferable that deformation in shape of the shot region is obtained based on a relative driving amount obtained from the relative positions of the mold 11 and the substrate 13 in the early stage of the contact process, and a relationship with the shearing force obtained in advance, and the position control is performed in consideration of this. This means that the target positions represented by the target position data are set at the relative positions of the mold 11 and the substrate 13 for making the relative position deviation amount of the mold 11 and the substrate 13 equal to a predetermined amount. More specifically, the target positions represented by the target position data are set at relative positions of the mold 11 and the substrate 13 for matching the barycentric position of the pattern surface 11a of the mold 11 and the barycentric position of the shot region of the substrate 13. This makes it possible to match the barycentric position of the pattern surface 11a of the mold 11 and the barycentric position of the shot region of the substrate 13 when the shearing force is generated between the mold 11 and the substrate 13 as shown in FIG. 9C.

The pattern of the cured product that has been formed using the imprint apparatus 1 is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 10A:
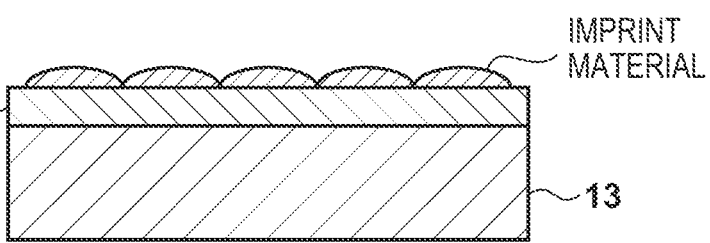
FIGS. 10A to 10F are views for explaining a method of manufacturing an article.

A detailed method of manufacturing the article will now be described. As shown FIG. 10A, the substrate 13 such as a silicon wafer having a processing target material such as an insulator formed on its surface is prepared, and then an imprint material is applied on the surface of the processing target material by an inkjet method or the like. A state is shown here in which the imprint material formed into a plurality of droplets is applied on the substrate.

Figure 10B:
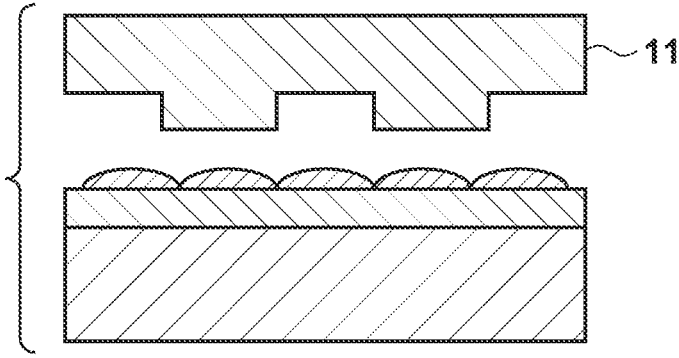
Figure 10C:
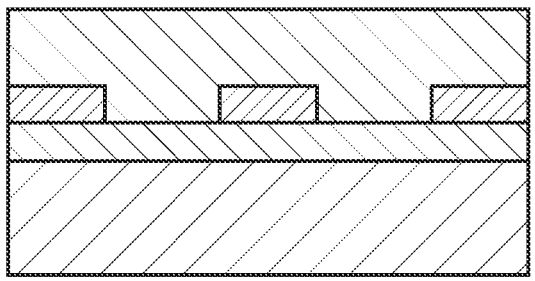

As shown in FIG. 10B, a side of the imprinting mold 11 on which its three-dimensional pattern is formed faces the imprint material on the substrate. As shown in FIG. 10C, the mold 11 and the substrate 13 to which the imprint material is applied are brought into contact with each other, applying a pressure. The imprint material fills the gap between the mold 11 and the processing target material. The imprint material is cured by irradiating it with light as curing energy through the mold 11 in this state.

Figure 10D:
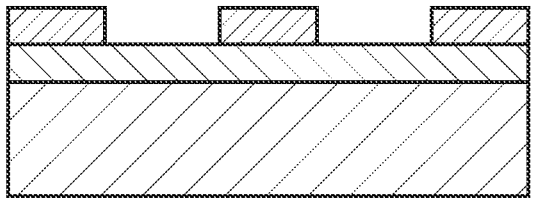

As shown in FIG. 10D, the pattern of the cured product of the imprint material is formed on the substrate by releasing the mold 11 and the substrate 13 from each other after curing the imprint material. The pattern of this cured product has a shape such that the concave portion of the mold 11 corresponds to the convex portion of the cured product, and the convex portion of the mold 11 corresponds to the concave portion of the cured product. That is, the three-dimensional pattern of the mold 11 is transferred to the imprint material.

Figure 10E:
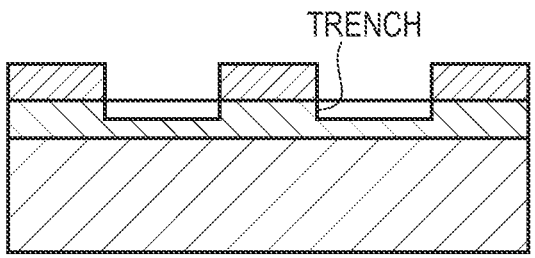
Figure 10F:
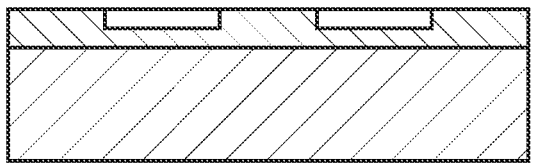

As shown in FIG. 10E, out of the surface of the processing target material, portions without the cured product or portions where the cured products remain thin are removed and become trenches by performing etching using the pattern of the cured product as an etching resistant mask. As shown in FIG. 10F, an article having the trenches formed on the surface of the processing target material can be obtained by removing the pattern of the cured product. Although the pattern of the cured product is removed here, the pattern of the cured product may be utilized as, for example, an interlayer dielectric film included in the semiconductor element or the like, that is, a constituent member of the article without removing it even after processing.

Note that in this embodiment, a mode in which a pattern is formed on a substrate by applying an imprint material to the substrate 13 and bringing the mold 11 into contact with the imprint material has mainly been described. However, the present invention is not limited to this mode. It is also possible to obtain the same effect by a mode in which, for example, a pattern is formed on a substrate by applying an imprint material to the mold 11 and bringing the substrate 13 into contact with the mold 11 to which the imprint material is applied.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-129596 filed on Jun. 30, 2017 and Japanese Patent Application No. 2018-110511 filed on Jun. 8, 2018, which are hereby incorporated by reference herein in their entirety.

What is claimed is:

1. An imprint apparatus that forms a pattern of an imprint material on a substrate by using a mold, the apparatus comprising:
    a measurement unit including a scope configured to obtain position data by measuring relative positions of the mold and the substrate;
    a driving system configured to drive at least one of the mold and the substrate;
    a shape deformer configured to deform at least one of the mold and the substrate; and
    at least one processor communicatively connected to at least one memory and configured to execute instructions stored in the memory to function as a control unit configured to control the driving system and the shape deformer such that parts of position control of controlling the relative positions of the mold and the substrate, and shape control of deforming at least one of the mold and the substrate are performed concurrently,
    wherein the control unit is further configured to control the driving system based on position data obtained by the measurement unit, and target position data representing relative target positions of the mold and the substrate, and
    wherein the control unit is further configured to apply, to the target position data, time-series data representing relative positions of the mold and the substrate that change at each time during which the shape control is performed in accordance with deformation in at least one of the mold and the substrate by the shape deformer.

2. The apparatus according to claim 1, wherein the time-series data represents relative positions of the mold and the substrate that change nonlinearly at each time during which the shape control is performed.

3. The apparatus according to claim 1, wherein the time-series data represents at least one of a relative shift amount of the mold and the substrate, and a relative rotation amount of the mold and the substrate that changes at each time during which the shape control is performed.

4. The apparatus according to claim 3, wherein the time-series data represents at least one of a relative shift amount of the mold and the substrate, and a relative rotation amount of the mold and the substrate at a start of a contact process of bringing the mold and the imprint material on the substrate into contact with each other.

5. The apparatus according to claim 1, wherein the target positions include relative positions of the mold and the substrate for setting a relative position deviation amount of the mold and the substrate at zero.

6. The apparatus according to claim 1, wherein the target positions include relative positions of the mold and the substrate for making a relative position deviation amount of the mold and the substrate equal to a predetermined amount.

7. The apparatus according to claim 6, wherein the target positions include relative positions of the mold and the substrate for matching a barycentric position of a pattern of the mold and a barycentric position of a shot region of the substrate.

8. The apparatus according to claim 1, wherein the control unit is further configured to apply the time series data to obtain difference data as a difference between the position data and the target position data, and input the difference data to a driver of the driving system.

9. The apparatus according to claim 8, wherein the control unit is further configured to obtain the time-series data from position data obtained by measuring the relative positions of the mold and the substrate using the measurement unit while deforming at least one of the mold and the substrate by the deformation unit.

10. The apparatus according to claim 1, wherein based on the target position data and position data obtained by the measurement unit, the apparatus repeats a process of controlling the driving system a plurality of times.

11. The apparatus according to claim 1, wherein the measurement unit obtains the position data by detecting a mark provided on the mold and a mark provided on the substrate.

12. The apparatus according to claim 1, wherein the deformation in at least one of the mold and the substrate by the shape deformer is performed based on at least one of a result measured in the imprint apparatus and a result measured by a measurement device outside the imprint apparatus.

13. A method of manufacturing an article, the method comprising:
forming a pattern on a substrate by using an imprint apparatus;
processing the substrate on which the pattern is formed in the forming; and
manufacturing the article from the substrate in the processing,
wherein the imprint apparatus forms a pattern in an imprint material on the substrate by using a mold, and includes:
a measurement unit including a scope configured to obtain position data by measuring relative positions of the mold and the substrate;
a driving system configured to drive at least one of the mold and the substrate;
a shape deformer configured to deform at least one of the mold and the substrate; and
at least one processor communicatively connected to at least one memory and configured to execute instructions stored in the memory to function as a control unit configured to control the driving system and the shape deformer such that parts of position control of controlling the relative positions of the mold and the substrate, and shape control of deforming at least one of the mold and the substrate are performed concurrently,
wherein the control unit is further configured to control the driving system based on position data obtained by the measurement unit, and target position data representing relative target positions of the mold and the substrate, and
wherein the control unit is further configured to apply, to the target position data, time-series data representing relative positions of the mold and the substrate that change at each time during which the shape control is performed in accordance with deformation in at least one of the mold and the substrate by the shape deformer.

14. An imprint apparatus that forms a pattern of an imprint material on a substrate by using a mold, the apparatus comprising:
a measurement unit including a scope configured to obtain position data by measuring relative positions of the mold and the substrate;
a driving system configured to drive at least one of the mold and the substrate;
a shape deformer configured to deform at least one of the mold and the substrate; and
at least one processor communicatively connected to at least one memory and configured to execute instructions stored in the memory to function as a control unit configured to control the driving system and the shape deformer such that parts of position control of controlling the relative positions of the mold and the substrate, and shape control of deforming at least one of the mold and the substrate are performed concurrently,
wherein the control unit is further configured to control the driving system based on position data obtained by the measurement unit, and target position data representing relative target positions of the mold and the substrate, and
wherein the control unit is further configured to apply, to the target position data, time-series data after a start of driving of the position control out of time-series data representing relative positions of the mold and the substrate that change during the shape control of deforming at least one of the mold and the substrate by the shape deformer is performed.

15. An imprint apparatus that forms a pattern of an imprint material on a substrate by using a mold, the apparatus comprising:
a measurement unit including a scope configured to obtain position data by measuring relative positions of the mold and the substrate;
a driving system configured to drive at least one of the mold and the substrate;
a shape deformer configured to deform at least one of the mold and the substrate; and
at least one processor communicatively connected to at least one memory and configured to execute instructions stored in the memory to function as a control unit configured to control the driving system and the shape deformer such that at least parts of position control of controlling the relative positions of the mold and the substrate, and shape control of deforming at least one of the mold and the substrate are performed concurrently,
wherein the control unit is further configured to control the driving system based on position data obtained by the measurement unit, and target position data representing relative target positions of the mold and the substrate, and
wherein the target position data is updated in accordance with an operation of the shape deformer.

16. The apparatus according to claim 15, wherein the target position data is updated based on information representing relative positions of the mold and the substrate that change in accordance with deformation in at least one of the mold and the substrate by the shape deformer.

17. The apparatus according to claim 15, wherein an initial value of target position represented by the target position data includes relative positions of the mold and the substrate for setting a relative position deviation amount of the mold and the substrate at zero.

18. The apparatus according to claim 15, wherein an initial value of target position represented by the target position data includes relative positions of the mold and the substrate for making a relative position deviation amount of the mold and the substrate equal to a predetermined amount.

19. The apparatus according to claim 15, wherein based on the target position data and position data obtained by the measurement unit, the apparatus repeats a process of controlling the driving system a plurality of times.

20. The apparatus according to claim 15, wherein the deformation in at least one of the mold and the substrate by the shape deformer is performed based on at least one of a result measured in the imprint apparatus and a result measured by a measurement device outside the imprint apparatus.

\* \* \* \* \*